United States Patent
Byron et al.

(10) Patent No.: US 9,453,190 B1
(45) Date of Patent: Sep. 27, 2016

(54) SURFACE TREATMENT OF TEXTURED SILICON

(71) Applicant: International Business Machines Corporation, Armonk, NY (US)

(72) Inventors: Whitney T. Byron, San Fernando (TT); Joel P. de Souza, Putnam Valley, NY (US); Ning Li, White Plains, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/938,961

(22) Filed: Nov. 12, 2015

(51) Int. Cl.
| | | |
|---|---|---|
| C11D 11/00 | (2006.01) | |
| H01L 31/0216 | (2014.01) | |
| H01L 31/0236 | (2006.01) | |
| H01L 31/18 | (2006.01) | |
| B08B 3/08 | (2006.01) | |
| C11D 7/02 | (2006.01) | |

(52) U.S. Cl.
CPC .......... *C11D 11/0047* (2013.01); *B08B 3/08* (2013.01); *C11D 7/02* (2013.01); *C11D 11/0064* (2013.01); *H01L 31/02167* (2013.01); *H01L 31/02363* (2013.01); *H01L 31/186* (2013.01)

(58) Field of Classification Search
CPC .......... H01L 31/068; H01L 31/1868; H01L 31/0236; H01L 31/02167; H01L 31/02363; H01L 31/186; C11D 11/0047; C11D 7/02; B08B 3/08
See application file for complete search history.

(56) References Cited

U.S. PATENT DOCUMENTS

| | | | |
|---|---|---|---|
| 2010/0006940 A1* | 1/2010 | Kakehata | .......... H01L 21/76254 257/347 |
| 2010/0317146 A1 | 12/2010 | Sinha et al. | |
| 2011/0126892 A1 | 6/2011 | Putnam et al. | |
| 2011/0240997 A1 | 10/2011 | Rockenberger et al. | |
| 2012/0153250 A1* | 6/2012 | Modawar | ........ H01L 31/035227 257/9 |

FOREIGN PATENT DOCUMENTS

GB EP 0718873 A2 11/1995

OTHER PUBLICATIONS

Taguchi, M., et al., "High efficiency HIT solar cell on thin (<100 μm) silicon wafer", Proc. 24th European Photovoltaic Solar Energy Conference (EUPVC), Date of Conference: Sep. 21-25, 2009, pp. 1690-1693, Conference Location: Hamburg, Germany.

Shu, B., et al., "Alternative approaches for low temperature front surface passivation of interdigitated back contact silicon heterojunction solar cell", Proc. 35th IEEE Photovoltaic Specialists Conference (PVSC), Date of Conference: Jun. 20-25, 2010, pp. 3223-3228, Conference Location: Honolulu, Hawaii.

(Continued)

*Primary Examiner* — Duy Deo

(74) *Attorney, Agent, or Firm* — Scully, Scott, Murphy & Presser, P.C.; Louis J. Percello, Esq.

(57) ABSTRACT

A method of removing contaminants from a textured surface of crystalline silicon includes exposing the surface to a gas comprising ozone and then immersing the surface in an acid solution comprising hydrogen peroxide and sulfuric acid. A further acid dip using HF can be used to remove silicon oxide from the surface.

19 Claims, 3 Drawing Sheets

(56) References Cited

OTHER PUBLICATIONS

Ai, Y., et al., "Process Optimization for High Efficiency Heterojunction c-Si Solar Cells Fabrication Using Hot-Wire Chemical Vapor Deposition", Conference Paper NREL/CP-5200-54099, Jun. 3-8, 2012, Presented at 2012 IEEE Photovoltaic Specialists Conference, 6 pages, http://www.osti.gov/bridge.

Mudigonda, S., "Characterization of fundamental parameters of front junction amorphous/crystalline silicon heterojunction solar cells using various electrical methods", Doctoral dissertation, University of Delaware, Summer 2010.

Mews, M., et al., "Amorphous/crystalline silicon heterojunction solar cells with black silicon texture", Phys. Status Solidi RRL, Jul. 2014, pp. 831-835, 8, No. 10.

Saha, S. "Cost Effective High Efficiency Solar Cells", Doctoral Thesis, University of Texas at Austin, Aug. 2014, 125 pages.

Granata, S. N., et al., "Improved Surface Cleaning by In Situ Hydrogen Plasma for Amorphous/Crystalline Silicon Heterojunction Solar Cells", Solid State Phenomena, Jan. 2013, pp. 321-323, vol. 195.

Angermann, H., "Passivation of structured p-type silicon interfaces: Effect of surface morphology and wet-chemical pre-treatment", Applied Surface Science, Oct. 2008, pp. 8067-8074, 254.

Angermann, H., "Conditioning of Si-interfaces by wet-chemical oxidation: Electronic interface properties study by surface photovoltage measurements", Applied Surface Science, Sep. 2014, pp. 3-16, 312.

\* cited by examiner

SURFACE TREATMENT OF TEXTURED SILICON

BACKGROUND

The present application relates generally to methods for treating single crystal silicon, and more specifically to cleaning methods for improving surface passivation of textured crystalline silicon for solar cell applications.

Solar cells convert incident radiation such as sunlight into electrical energy. The process of converting light (photons) into electrical energy (voltage) is called the photovoltaic (PV) effect. Solar cells are fashioned from semiconducting materials, which can be monocrystalline, polycrystalline, or amorphous. An exemplary semiconducting material is monocrystalline (i.e., single-crystal) silicon. The performance of a solar cell is measured in terms of its efficiency of converting light energy into electrical energy. The efficiency of the cell is calculated as the ratio of the amount of electric output to the amount of incident light.

A typical solar cell includes a junction of a p-type semiconductor and an n-type semiconductor (p-n junction). In the cell, electron-hole pairs are generated by photons. The electrons and holes migrate respectively to the p-type and n-type semiconductors and accumulate in two opposing contacts. The resulting separation of charge creates a voltage that can be used as a source of electric power.

The efficiency of a solar cell can be increased by providing a roughened (textured) surface that presents a gradual interface between air and the cell. A textured surface scatters incident light at oblique angles, and lengthens its optical path, which effectively traps a greater percentage of light within the cell (i.e., reduces reflective losses).

Chemical processes for texturing silicon introduce surface contamination that if unremoved will adversely affect carrier lifetime and cell efficiency. Thus, efficient and effective cleaning methods for textured silicon used for solar cell applications are desired.

SUMMARY

In accordance with embodiments of the present application, a method of removing contaminants from a textured surface of crystalline silicon includes exposing the surface to a gas comprising ozone and then immersing the surface in an acid solution comprising hydrogen peroxide and sulfuric acid. A further acid dip using HF can be used to remove silicon oxide from the silicon surface.

A further method of cleaning a textured surface of crystalline silicon includes exposing the surface to ozone gas and then immersing the surface in a mixture of hydrogen peroxide and sulfuric acid.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
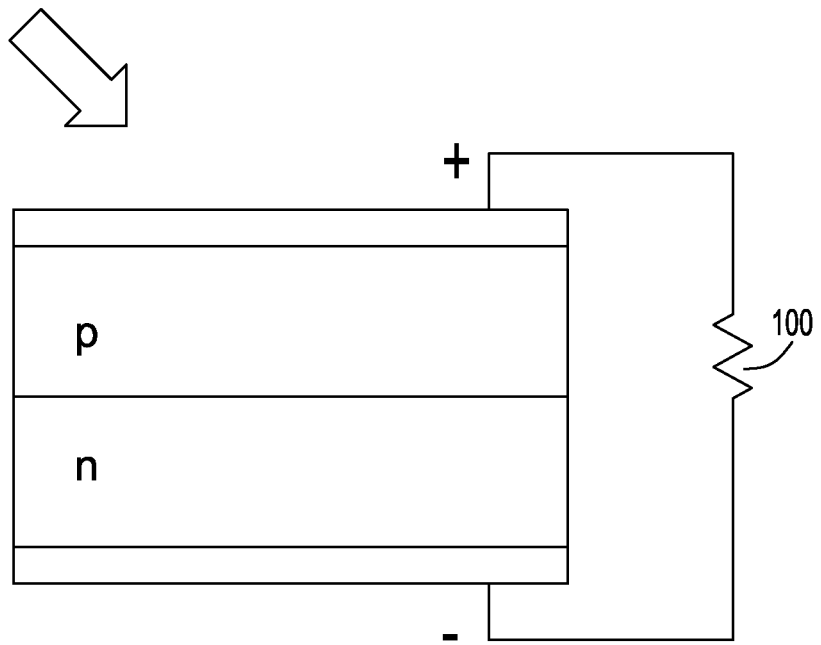
FIG. 1 is a schematic diagram of the p-n junction of a conventional solar cell.

Reference will now be made in greater detail to various embodiments of the subject matter of the present application, some embodiments of which are illustrated in the accompanying drawings. The same reference numerals will be used throughout the drawings to refer to the same or similar parts. It is noted that the drawings are provided for illustrative purposes and, as such, may not be drawn to scale.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

A typical photovoltaic cell includes two layers of doped silicon. One layer is modified to have an excess of free electrons (n-type), while the other layer is modified to have an excess of electron holes or vacancies (p-type). When the distinctly doped semiconductor layers are joined, free electrons in the n-type layer travel into the p-type layer to fill the electron holes. The combining of electrons and holes at the p-n junction creates a barrier that makes it increasingly difficult for additional electrons to cross. As the electrical imbalance reaches equilibrium, a static electric field forms across the boundary.

When light energy of an appropriate wavelength strikes the cell and is absorbed, electrons travel randomly. Electrons close to the boundary (p-n junction) can be swept across the junction by the static field. Because the electrons can cross the boundary in one direction, but are unable to return due to the field gradient, a charge imbalance results between the two semiconductor regions. Electrons that are swept into the n-type layer by the effects of the static field have a predisposition to vacate the layer in order to correct the charge imbalance. Thus, the electrons will follow another path if one is provided.

By providing an external circuit by which the electrons can return to the p-type layer, a current flow is produced provided that light energy is incident on the solar cell. Metal contacts are applied to the outer faces of the two semiconductor layers, and provide a path to the external circuit that connects the two layers. Thus, as shown schematically in FIG. 1, a solar cell provides electrical power to a load 100 when illuminated.

An example solar cell is a heterojunction intrinsic thin layer (HIT) solar cell. HIT solar cells are hybrids of single crystal silicon surrounded by thin amorphous silicon layers.

Figure 2:
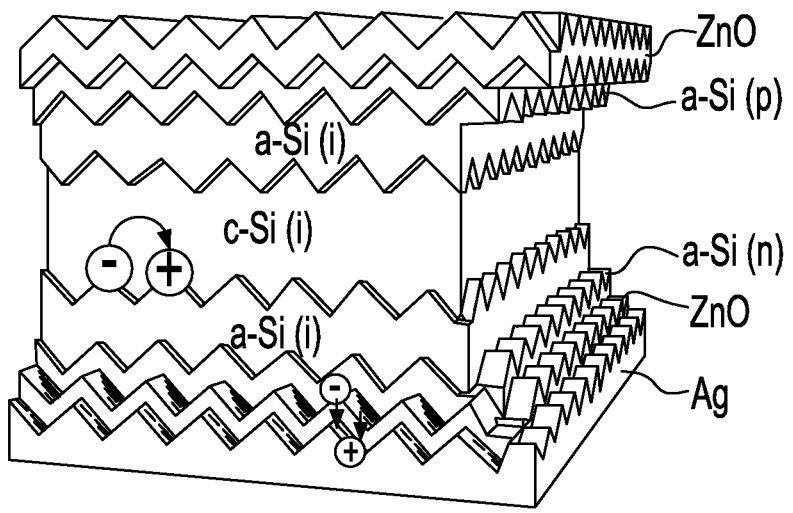
FIG. 2 is a perspective cross-sectional view of a heterojunction intrinsic thin layer (HIT) solar cell.

A typical HIT-type solar cell architecture is shown in FIG. 2. The cell comprises, from top to bottom, a layer of transparent conducting oxide (ZnO), a layer of p-type amorphous silicon (~10 nm), a layer of intrinsic amorphous silicon (~10 nm), a layer of n-type crystalline silicon (~100 microns), a layer of intrinsic amorphous silicon (~10 nm), a layer of n-type amorphous silicon (~10 nm), a layer of transparent conducting oxide, and back side electrical contact (Ag).

When light is incident on the cell, recombination of the carriers occurs within and at the surface of the structure. The thin amorphous silicon layers passivate the crystalline silicon (c-Si) surface and provide a heterojunction having a wide bandgap window layer that improves the open circuit voltage. In embodiments, the layers of transparent conducting oxide comprise indium tin oxide (ITO) or zinc oxide (ZnO). HIT solar cells can achieve a conversion efficiency in excess of 20%.

Figure 3:
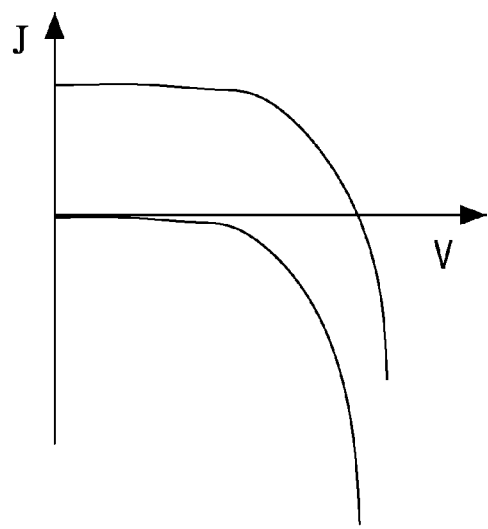
FIG. 3 is a plot of current versus voltage for a conventional solar cell.

Typical current-voltage characteristics of a solar cell are depicted in FIG. 3. The applied potential is in the direction of forward bias. The lower trace shows the turn-on and subsequent build-up of forward bias current. Without illumination, no current flows through the device unless an external potential is applied. With incident electromagnetic radiation, however, the IV curve shifts up (upper trace) consistent with an external current flow to a passive load.

Figure 4:
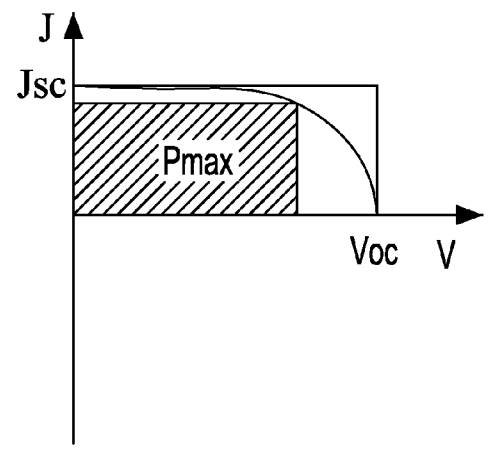
FIG. 4 is a plot showing the theoretical maximum power output for a solar cell.

With reference to FIG. 4, the short circuit current, $J_{sc}$, flows with zero external resistance (V=0) and represents the maximum current output at any illumination level. The open circuit voltage, $V_{oc}$, is the potential across the terminals of the solar cell for a large external load resistance. The power delivered to the load is zero at both extremes and attains a maximum ($P_{max}$) at a finite value of load resistance.

The efficiency of a solar cell is the ratio of the output electrical power to the optical power incident on the cell. Maximum efficiency is attained with the power delivered to the load is $P_{max}$. A characteristic of a solar cell is its fill factor, FF, which is defined as the ratio of $P_{max}$ to the product of $V_{oc}$ and $J_{sc}$ (i.e., the larger rectangle in FIG. 4). Thus, maximum efficiency may be written as $\eta_{max}=P_{max}/P_{in}=(J_{sc})(V_{oc})(FF)/P_{in}$, where $P_{in}$ is typically expressed in units of mW/cm$^2$.

The short circuit current $J_{sc}$ is directly proportional to the incident optical power ($P_{in}$), while $V_{on}$ increase logarithmically with the incident optical power. The short circuit current $J_{sc}$ may be increased through silicon texturing, while the open circuit voltage may be increased through surface passivation.

The open circuit voltage ($V_{oc}$) can be expressed as $V_{oc} \approx (kT/q) \ln(J_{sc}/J_0)$, where k is the Boltzmann constant, T is absolute temperature, and q is the magnitude of the electrical charge on an electron. $J_0$ is the reverse saturation current density, with $J_{sc}/J_0 \gg 1$ and $J_0$ proportional to $1/\tau$, where $\tau$ is the minority carrier lifetime.

The minority carrier lifetime ($\tau$) measures how long a carrier is active before recombining. As illustrated schematically in FIG. 2, recombination occurs in the bulk as well as on the textured crystalline silicon surface. A factor affecting carrier lifetime is surface quality. The carrier lifetime can vary by several orders of magnitude, from approximately 1 ns to 1 ms in conventional silicon solar cell materials.

To decrease reflectance and increase efficiency, silicon-based solar cells typically include textured crystalline silicon (c-Si). Surface texture promotes light trapping based on geometrical optics, e.g., the texturing is on a scale equal to or greater than optical wavelengths of the incident light causing the incident light to reflect multiple times and thereby enhance absorption.

A silicon substrate is optionally pre-cleaned prior to texturization. The pre-clean process can be used to remove unwanted contamination, surface damage and/or other materials that could affect subsequent processing steps. In one embodiment, the pre-clean process may be performed by treating the substrate with an acid solution and/or solvent to remove surface particles, native oxide or other contaminants from the surface.

Treating may comprise spraying, flooding, immersing and the like. A pre-clean solution may comprise a hydrogen fluoride (HF) aqueous solution comprising a mixture of hydrogen fluoride and deionized water. In one embodiment, the pre-clean solution is a hydrogen fluoride (HF) aqueous solution having an HF concentration between 0.1 weight percent and 4 weight percent, such as between 1 weight percent and 2 weight percent to deionized water. The pre-clean process time may be from 5 seconds to 600 seconds, such as 30 seconds to 240 seconds.

The crystalline silicon (c-Si) surface may be textured using a wet-chemical etch. In embodiments, texturing forms pyramidal structures having base and height dimensions that independently range from 5 to 20 microns. For instance, silicon <100> etches anisotropically along the (111) crystal plane, with a 54.74° angle from the (100) plane. In embodiments, a textured crystalline silicon surface comprises a random pyramid textured surface.

Figure 5A:
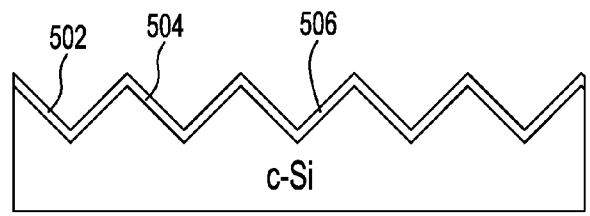
FIG. 5A is a cross-sectional schematic showing raised pyramidal features on a surface of a textured silicon substrate.
Figure 5B:
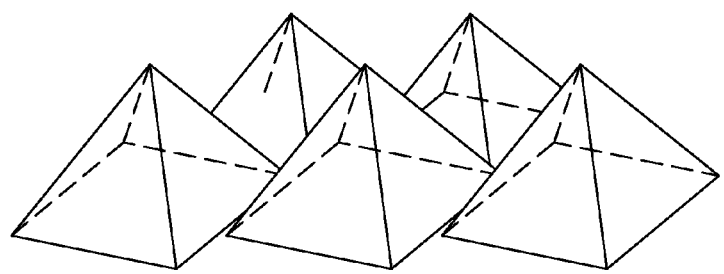
FIG. 5B is a perspective view of square pyramidal features.

In embodiments, as illustrated in FIGS. 5A and 5B, the pyramidal structures are raised features that extend outwardly from the surface. With reference to FIG. 5B, textured surface 502 includes pyramids 504. The pyramids can have substantially the same shape determined by the crystallographic properties of the wafer material. For example, the pyramids can all have a quadratic base.

In one embodiment, the substrate is an n-type or p-type crystalline silicon substrate and one or more layers 506 such as passivation layers such as silicon nitride are deposited after texturing to form part of the p-n junction of the solar cell device.

Texturing (etching) of the c-Si surface can be performed by heating the wet etchant (e.g., heating to a temperature in the range of 60 to 80° C.) and exposing the silicon surface to the heated etchant (e.g., for a time ranging from 5 to 30 min).

An example wet etchant used for texturing includes a mixture of an alkaline chemical such as potassium hydroxide (KOH) or sodium hydroxide (NaOH) and isopropyl alcohol (IPA). The IPA functions to mask specific silicon sites, preventing etching, and thereby form the pyramidal structures due to the high selectivity of KOH or NaOH dissolution of silicon for different crystallographic orientations.

A single crystal silicon substrate may be in a circular wafer form, such as those used in semiconductor processing, or having a rectangular or square shape such as solar wafers, having dimensions of up to 156 mm×156 mm. The substrate thickness may also vary. For example, the thickness may be in the range of 80 microns to 200 microns for solar wafers.

Surface texturing can be done on one or both sides of a substrate. As a result of texturing, the surface area of a silicon substrate increases by a factor of roughly 1.2. Without wishing to be bound by theory, the increase in surface area is believed to lead to a higher recombination rate and an attendant decrease in carrier lifetime.

After texturing, the etching solution as well as any residue from the etching process is desirably removed from the textured silicon surface prior to further processing. Disclosed herein are improved methods for efficiently and effectively cleaning the textured surface of c-Si. In embodiments, textured crystalline silicon that has been cleaned according to the disclosed methods exhibits carrier lifetimes that are greater than textured crystalline silicon cleaned according to comparative methods. Further, carrier lifetimes for textured crystalline silicon that has been cleaned according to the disclosed methods are comparable to carrier lifetimes for un-textured crystalline silicon.

In embodiments, a textured c-Si surface is sequentially exposed to ozone gas ($O_3$) and a wet acid etchant comprising sulfuric acid ($H_2SO_4$) and hydrogen peroxide ($H_2O_2$). The foregoing combination is an effective cleaning regime for semiconductor wafers. The ozone gas treatment, which in embodiments is a dry process, removes organic contaminants from the c-Si surface, while ionic and organic contaminants are removed via exposure to the acid.

Exposure to ozone can be carried out, for example, within a closed reaction vessel by placing the textured c-Si substrate within the vessel and providing within the vessel an atmosphere that comprises ozone gas.

Ozone treatment may be performed, for example, using an ultraviolet/ozone cleaning system (UVOCS, Inc., Lansdale, Pa.). The system contains a low pressure, quartz, mercury vapor lamp that generates 185 nm and 254 nm UV light. The ultraviolet/ozone cleaning system may be operated at a UV power of 25 to 100 mW/cm$^2$.

A sample to be textured is placed within a reaction chamber of the system and oxygen gas or atmospheric oxygen is delivered into the reaction chamber. During operation, molecular oxygen absorbs the 185 nm light and dissociates to atomic oxygen and ozone. Atomic oxygen is also generated from ozone that dissociates via the absorption of 254 nm UV light. Therefore, when both UV wavelengths are present, atomic oxygen is continuously generated, and ozone is continually formed and destroyed.

Simultaneously, organic contaminants such as photoresist, resins, oils and the like present on the textured c-Si surface are excited and/or dissociated by absorption of the 254 nm UV light. Excited species react with atomic oxygen and/or ozone to form non-condensing, volatile compounds such as $CO_2$ and $H_2O$ vapor that readily desorb from the surface. In embodiments, a near atomically clean textured surface can be achieved in less than 20 min (e.g., 5, 10 or 15 min) at a process temperature of 23° C. One or both sides of a textured silicon substrate can be treated with ozone gas.

A further example of an ozone source is the ASTeX 8403 Ozone Generator (Applied Science and Technology, Inc., Woburn, Mass.). The ASTeX 8403 has an ozone production rating of 160 g/h, which can support a gas (~20% by weight ozone) flow rate of ~12 l/min.

Ozone exposure may oxidize the crystalline silicon (c-Si) textured surface. Because an oxide ($SiO_2$) layer is formed on the textured c-Si surface during the ozone treatment, an optional hydrofluoric acid (HF) treatment can be used following the ozone gas cleaning step to strip the oxide. In embodiments, dilute hydrofluoric acid (HF) is used to remove silicon oxide from silicon.

The concentration of the HF in the dilute solution can range from 2 to 10% (i.e., 1:50 to 1:10). The HF treatment may comprise spraying, flooding, immersing and the like and may be performed at room temperature (23° C.) for a period of between 1 and 10 minutes. The HF treatment leaves a hydrogen-terminated surface that may inhibit regrowth of native oxide. After the optional treatment with HF the substrate can be rinsed with deionized water.

Following the ozone treatment and optional HF treatment, the textured c-Si surface is cleaned with an acid solution comprising sulfuric acid ($H_2SO_4$) and hydrogen peroxide ($H_2O_2$). Because the acid solution is a strong oxidizer, it will remove ionic species and organic matter from the textured c-Si surface. It will also hydroxylate the silicon surface making it hydrophilic.

The acid solution can be prepared from aqueous mixtures of 96-98% sulfuric acid and 30-35% hydrogen peroxide at volume ratios of 2-4:1. The acid solution can be used at temperatures of 80° C. and higher. An example acid solution is a 3:1 mixture of concentrated sulfuric acid to hydrogen peroxide solution (such as a 30% hydrogen peroxide stock solution). Other acid solutions may use a 4:1 or even a 7:1 mixture.

The acid solution can be prepared by adding hydrogen peroxide to a bath of sulfuric acid. The mixture reaction is exothermic. Atomic oxygen begins to evolve immediately upon combining the peroxide with the sulfuric acid. Preparing the acid solution just prior to treating the textured crystalline silicon will ensure a relative abundance of atomic oxygen to facilitate removal of contaminants from the silicon surface (e.g., carbon in the form of $CO_2$).

In embodiments, the textured crystalline silicon substrate is immersed in a bath comprising the acid solution. While immersed, the substrate may be continuously rotated or otherwise agitated. Cleaning time with the acid solution can range from 10 to 40 min, after which time the substrate can be removed from the solution. The above-described ($H_2SO_4+H_2O_2$) acid solution is extremely corrosive and should be prepared in glass (e.g., Pyrex® glass) container in a well-ventilated space. After cleaning with the acid solution, the workpiece can be rinsed with deionized water, e.g., for 5 or 10 min.

Because cleaning with the acid solution may form an oxide ($SiO_2$) layer on the textured c-Si surface, an optional HF treatment as described above can be used following the wet etch to strip the oxide. After treatment with the acid solution (or after the HF treatment, if used) the substrate can be rinsed and dried in a standard spin-rinse dryer.

Thus, in one embodiment, a method of removing contaminants from a textured surface of crystalline silicon comprises exposing the surface to a gas comprising ozone, immersing the surface in a first acid solution comprising hydrogen peroxide and sulfuric acid, and immersing the surface in a second acid solution comprising hydrogen fluoride.

In a further embodiment, a method of cleaning a textured surface of crystalline silicon comprises exposing the surface to ozone gas, and then immersing the surface in a mixture of hydrogen peroxide and sulfuric acid.

In the various embodiments, an oxide-stripping HF dip can be used after ozone exposure but before immersion in the peroxide/sulfuric acid solution and/or after immersion in the peroxide/sulfuric acid solution.

EXAMPLES

The efficacy of the presently-disclosed cleaning method was assessed and contrasted with comparative methods for both textured and un-textured silicon <100> wafers. Minority carrier lifetime was evaluated for the several methods. The bulk carrier lifetime was measured with a photo conductance tester. With such a test, in transient mode a pulse of light strikes the sample and the decay of the conductance of the sample was measured with a radio-frequency (RF) coil.

Figure 6:
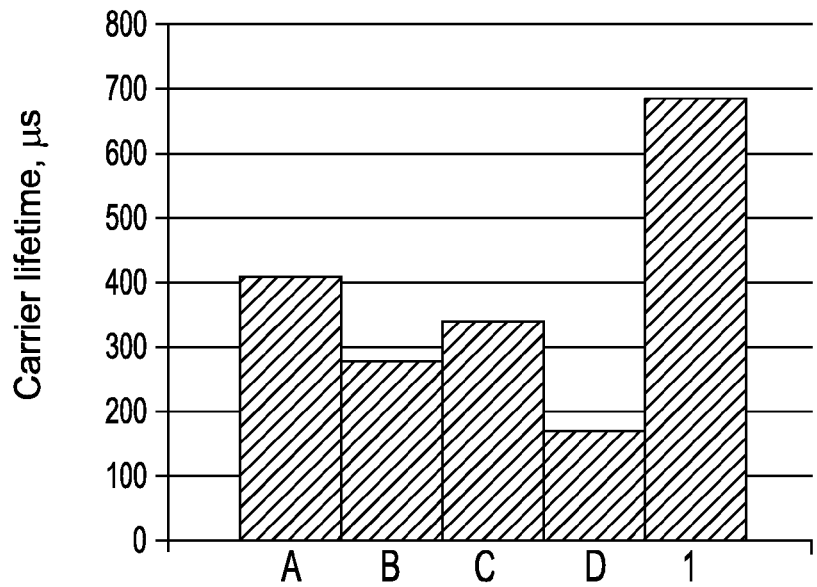
FIG. 6 is a plot showing minority carrier lifetimes for textured crystalline silicon cleaned using both comparative and inventive methods.

Cleaning conditions for the various test samples are summarized in Table 1. Samples 1 and 2 are exemplary, while samples A-G are comparative. Carrier lifetime data are depicted in FIGS. 5 and 6.

TABLE 1

Silicon cleaning chemistries

| Sample | Chemistry |
|---|---|
| 1 | $O_3$ (g)/$H_2SO_4$ + $H_2O_2$ (aq) |
| 2 | $O_3$ (g)/$H_2SO_4$ + $H_2O_2$ (aq) |
| A | $H_2SO_4$ + $H_2O_2$ (aq) |
| B | $HNO_3$ (aq) |
| C | $H_2SO_4$ + $H_2O_2$ (aq)/$HNO_3$ (aq) |
| D | $O_3$ (g) |
| E | $O_3$ (g)/RCA |
| F | $H_2SO_4$ + $H_2O_2$/$O_3$ (g) |
| G | $O_3$ (g)/$H_2SO_4$ + $H_2O_2$ (aq) (un-textured crystalline silicon) |

With reference first to FIG. 6, plotted are carrier lifetimes for textured crystalline silicon samples after treatment with a variety of comparative cleaning methods. Comparative samples A-D correspond respectively to samples treated with: (A) a $H_2SO_4$+$H_2O_2$ acid solution, (B) nitric acid, (C) a $H_2SO_4$+$H_2O_2$ acid solution followed by a nitric acid dip, and (D) ozone. Treatment times were 10 min, though shorter and longer times may be used. The resulting carrier lifetimes range from about 170 μs to about 400 μs.

In contrast, sample 1 corresponds to textured crystalline silicon treated according to a present embodiment, i.e., ozone exposure followed by treatment with a $H_2SO_4$+$H_2O_2$ acid solution. The carrier lifetime for sample 1 was about 690 μs. It is noteworthy that treatment with a $H_2SO_4$+$H_2O_2$ acid solution alone (sample A) and ozone alone (sample D) produce carrier lifetime results that are inferior to the result from sample 1.

Figure 7:
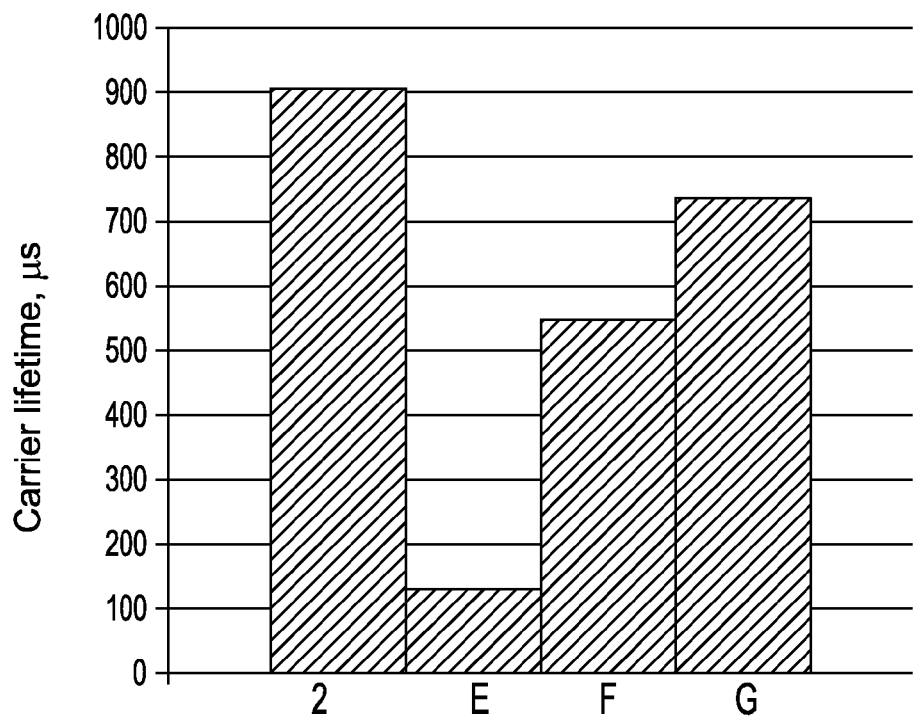
FIG. 7 is a plot showing minority carrier lifetimes for textured crystalline silicon cleaned using both comparative and inventive methods.

Turning to FIG. 7, plotted are carrier lifetimes for textured and un-textured crystalline silicon samples after different cleaning treatments that each include ozone. Comparative samples E-G correspond respectively to treatments with: (E) ozone followed by a conventional RCA clean, (F) a $H_2SO_4$+$H_2O_2$ acid solution followed by ozone, and (G) ozone followed by a $H_2SO_4$+$H_2O_2$ acid solution for un-textured crystalline silicon.

In contrast, sample 2 corresponds to textured crystalline silicon treated according to a present embodiment, i.e., ozone followed by treatment with a $H_2SO_4$+$H_2O_2$ acid solution. The carrier lifetime for sample 2 was about 900 μs. It is also noteworthy that treatment with a $H_2SO_4$+$H_2O_2$ acid solution followed by ozone (sample F) yields a carrier lifetime that is inferior to the results from sample 2.

In embodiments, textured crystalline silicon substrates cleaned using methods described herein have a bulk carrier lifetime greater than 600 microseconds, e.g., greater than 700, 800 or 900 microseconds.

As used herein, the singular forms "a," "an" and "the" include plural referents unless the context clearly dictates otherwise. Thus, for example, reference to a "p-type layer" includes examples having two or more such "p-type layers" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

As used herein, an element such as a layer or region that is "on" or "over" or "disposed over" a substrate or other layer refers to formation above, or in contact with, a surface of the substrate or layer. For example, where it is noted or recited that a layer is disposed over a substrate or other layer, it is contemplated that intervening structural layers may optionally be present between the layer and the substrate. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

While various features, elements or steps of particular embodiments may be disclosed using the transitional phrase "comprising," it is to be understood that alternative embodiments, including those that may be described using the transitional phrases "consisting" or "consisting essentially of" are implied. Thus, for example, implied alternative embodiments to an etchant that comprises sulfuric acid and hydrogen peroxide include embodiments where an etchant consists essentially of sulfuric acid and hydrogen peroxide and embodiments where an etchant consists of sulfuric acid and hydrogen peroxide.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed as new is:

1. A method of removing contaminants from a textured surface of crystalline silicon, comprising:
   texturing a surface of crystalline silicon, wherein said texturing comprises contacting the crystalline silicon with a wet etchant heated to 60° C. to 80° C., said wet etchant comprising a mixture of isopropyl alcohol and an alkaline chemical selected from the group consisting of KOH and NaOH;
   exposing the textured surface to a gas comprising ozone;
   immersing the textured surface in a first acid solution comprising hydrogen peroxide and sulfuric acid; and
   immersing the textured surface in a second acid solution comprising hydrogen fluoride.

2. The method of claim 1, wherein the exposing the textured surface to ozone gas precedes immersing the textured surface in the first acid solution.

3. The method of claim 1, wherein the crystalline silicon comprises a silicon wafer.

4. The method of claim 2, wherein the silicon wafer is a <100> oriented silicon wafer.

5. The method of claim 1, wherein the textured surface comprises a plurality of pyramidal features extending outwardly from the textured surface.

6. The method of claim 1, wherein the textured surface is dry during exposure to ozone gas.

7. The method of claim 1, wherein the gas comprising ozone is formed via a reaction with ultraviolet light and oxygen.

8. The method of claim 7, wherein the ultraviolet light comprises 185 nm and 254 nm radiation.

9. The method of claim 1, wherein the crystalline silicon, after removal of the contaminants, has a bulk carrier lifetime of at least 600 microseconds.

10. The method of claim 1, wherein the first acid solution comprises a 3:1 mixture by volume of sulfuric acid and hydrogen peroxide.

11. The method of claim 1, wherein the first acid solution temperature is at least 80° C. during the immersing.

12. The method of claim 1, further comprising immersing the textured surface in a third acid solution comprising hydrogen fluoride after exposing the textured surface to the ozone and prior to immersing the textured surface in the first acid solution.

13. The method of claim 1, wherein the contaminants are selected from the group consisting of photoresist, resins and oils.

14. A method of cleaning a textured surface of crystalline silicon, comprising:

texturing a surface of crystalline silicon, wherein said texturing comprises contacting the crystalline silicon with a wet etchant heated to 60° C. to 80° C., said wet etchant comprising a mixture of isopropyl alcohol and an alkaline chemical selected from the group consisting of KOH and NaOH;

exposing the textured surface to ozone gas; and then immersing the textured surface in a mixture of hydrogen peroxide and sulfuric acid.

15. The method of claim 14, wherein the textured surface is dry during exposure to ozone gas.

16. The method of claim 14, wherein the mixture of hydrogen peroxide and sulfuric acid is at a temperature of least 80° C. during the immersing.

17. The method of claim 14, further comprising immersing the textured surface in an HF solution after exposing the textured surface to the ozone and prior to immersing the textured surface in the mixture.

18. The method of claim 14, further comprising immersing the textured surface in an HF solution after immersing the texture surface in the mixture.

19. A method of removing contaminants from a textured surface of crystalline silicon, consisting of:

texturing a surface of crystalline silicon, wherein said texturing comprises contacting the crystalline silicon with a wet etchant heated to 60° C. to 80° C., said wet etchant comprising a mixture of isopropyl alcohol and an alkaline chemical selected from the group consisting of KOH and NaOH;

exposing the textured surface to a gas comprising ozone;

immersing the textured surface in a first acid solution comprising hydrogen peroxide and sulfuric acid; and immersing the textured surface in a second acid solution comprising hydrogen fluoride.

* * * * *